US010879861B2

(12) United States Patent
Park et al.

(10) Patent No.: US 10,879,861 B2
(45) Date of Patent: Dec. 29, 2020

(54) BIAS CIRCUIT AND AMPLIFYING DEVICE WITH BIAS COMPENSATION FUNCTION

(71) Applicant: Samsung Electro-Mechanics Co., Ltd., Suwon-si (KR)

(72) Inventors: Sang Wook Park, Suwon-si (KR); Dae Hee No, Suwon-si (KR); Hyun Jun Kim, Suwon-si (KR); Bo Hyun Hwang, Suwon-si (KR); Jun Goo Won, Suwon-si (KR); Da Hye Park, Suwon-si (KR); Sung Hwan Park, Suwon-si (KR); Ki Joong Kim, Suwon-si (KR); Yoshiyuki Tonami, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/456,102

(22) Filed: Jun. 28, 2019

(65) Prior Publication Data

US 2020/0287510 A1 Sep. 10, 2020

(30) Foreign Application Priority Data

Mar. 6, 2019 (KR) .................. 10-2019-0025945

(51) Int. Cl.
*H03F 3/60* (2006.01)
*H03F 1/30* (2006.01)
*H03F 3/21* (2006.01)
*H03F 1/02* (2006.01)

(52) U.S. Cl.
CPC ............. *H03F 3/60* (2013.01); *H03F 1/0277* (2013.01); *H03F 1/305* (2013.01); *H03F 3/21* (2013.01)

(58) Field of Classification Search
USPC .................... 330/310, 285, 296–297, 127
See application file for complete search history.

(56) References Cited

U.S. PATENT DOCUMENTS 8,150,343 B2 * 4/2012 Ramachandra Reddy .................. H03F 1/223
455/127.2
2017/0093339 A1 3/2017 Wu et al.

FOREIGN PATENT DOCUMENTS

JP 2003-510882 A 3/2003
WO WO 01/22604 A1 3/2001

* cited by examiner

*Primary Examiner* — Hieu P Nguyen
(74) *Attorney, Agent, or Firm* — NSIP Law

(57) ABSTRACT

A bias circuit of an amplifying device including amplifying circuits and a bypass circuit responding to a first control signal, includes a first bias circuit, a second bias circuit, and a compensating circuit. The first bias circuit is configured to supply a first base bias voltage to a first amplifying circuit of the amplifying circuits in response to a second control signal. The second bias circuit is configured to supply a second base bias voltage to a second amplifying circuit of the amplifying circuits in response to a third control signal. The compensating circuit is connected to either one or both of the first bias circuit and the second bias circuit, and configured to vary an impedance in response to a fourth control signal, and compensate for either one or both of the first base bias voltage and the second base bias voltage based on the varied impedance.

23 Claims, 10 Drawing Sheets

BIAS CIRCUIT AND AMPLIFYING DEVICE WITH BIAS COMPENSATION FUNCTION

CROSS-REFERENCE TO RELATED APPLICATION(S)

This application claims the benefit under 35 USC 119(a) of Korean Patent Application No. 10-2019-0025945 filed on Mar. 6, 2019 in the Korean Intellectual Property Office, the entire disclosure of which is incorporated herein by reference for all purposes.

BACKGROUND

1. Field

The following description relates to a bias circuit and an amplifying device with a bias compensation function.

2. Description of Related Art

In general, a power amplifier is applied to a communications device to amplify a radio frequency (RF) signal to a suitable power levels for transmissions through an antenna. As an example, in a case of a power amplifier for Wi-Fi of a mobile device, a large amount of power is consumed in a front-end stage of the power amplifier, which may affect battery usage and generate a large amount of heat.

Recently, as an example, a mobile terminal may include a plurality of power amplifiers. In this case, in order to limit power consumption and heat generation, some of the plurality of power amplifiers operate in a high power mode while the others operate in a low power mode, thereby limiting total power consumption.

Such a power amplifier for Wi-Fi has a specific gain for an input signal level and has been designed so that a gain does not vary greatly depending on the power source voltage or bias. However, as an example, a method for providing a low power and thermal limiting solution corresponding to the latest communications standards often requires a performance standard in which the power amplifier operates in one or more operating modes, and a gain of each of the operating modes has a difference of 14 dB or more.

As an example, a conventional power amplifier module may include a plurality of different amplification paths to implement an operating mode having a relatively large gain difference. Each of the plurality of amplification paths may include one or more power amplifiers corresponding to each operating mode.

However, such a conventional power amplifier includes an additional power amplifier circuit and an impedance matching circuit in the same integrated circuit (IC), which may cause an increase in size and costs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bias circuit of an amplifying device including amplifying circuits, connected to each other in series, and a bypass circuit responding to a first control signal, includes a first bias circuit, a second bias circuit, and a compensating circuit. The first bias circuit is configured to supply a first base bias voltage to a first amplifying circuit of the amplifying circuits in response to a second control signal. The second bias circuit is configured to supply a second base bias voltage to a second amplifying circuit of the amplifying circuits in response to a third control signal. The compensating circuit is connected to either one or both of the first bias circuit and the second bias circuit, and configured to vary an impedance in response to a fourth control signal, and compensate for either one or both of the first base bias voltage and the second base bias voltage based on the varied impedance.

The first bias circuit may be configured to supply the first base bias voltage to the first amplifying circuit connected in parallel to the bypass circuit.

The second bias circuit may be configured to supply the second base bias voltage to the second amplifying circuit connected in parallel to the bypass circuit.

The first bias circuit may be configured to supply the first base bias voltage in response to the second control signal.

The second bias circuit may be configured to variably adjust the second base bias voltage in response to the third control signal.

The first bias circuit may include a first switch circuit configured to switch on or off in response to the second control signal, a first current bias circuit configured to connect to a reference voltage terminal through the first switch circuit to generate a first internal current based on a reference voltage, and a first bias output circuit comprising a first transistor generating the first base bias voltage based on the first internal current.

The second bias circuit may include a first resistance variable circuit, a second current bias circuit, a second bias output circuit, and a capacitor. The first resistance variable circuit may be configured to vary a resistance value in response to the third control signal. The second current bias circuit may be configured to connect to the reference voltage terminal through the first resistance variable circuit to generate a second internal current based on the reference voltage and the resistance value of the first resistance variable circuit. The second bias output circuit may include a second transistor generating the second base bias voltage based on the second internal current. The capacitor may be configured to connect between a base of the second transistor and a ground.

The compensating circuit may be configured to have a capacitance or resistance value varied in response to the fourth control signal, and compensate for the second base bias voltage of the second bias circuit.

Upon the amplifying device being configured to operate in an amplification mode, the first bias circuit and the second bias circuit may be configured to operate in an enabled state, and the compensating circuit may be configured to have a first impedance. Upon the amplifying device being configured to operate in a bypass mode, the first bias circuit supplying the first base bias voltage to the first amplifying circuit to which the bypass circuit may be connected to in parallel operates in a disabled state, and the second bias circuit may be configured to operate in the enabled state. The compensating circuit may be configured to have a second impedance greater than the first impedance.

Upon the amplifying device being configured to operate in an amplification mode, the first bias circuit and the second bias circuit may be configured to operate in an enabled state, and the compensating circuit may be configured to have a first impedance. Upon the amplifying device being configured to operate in a bypass mode, the second bias circuit supplying the second base bias voltage to the second amplifying circuit to which the bypass circuit is connected to in parallel may operate in a disabled state, and the first bias circuit may be configured to operate in the enabled state. The compensating circuit may be configured to have a second impedance greater than the first impedance.

In another general aspect, an amplifying device includes a first amplifying circuit and a second amplifying circuit, a bypass circuit, a first bias circuit, a second bias circuit, and a compensating circuit. The first amplifying circuit and the second amplifying circuit are connected to each other in series between an input terminal and an output terminal of the amplifying device. The bypass circuit, connected in parallel to one of the first amplifying circuit and the second amplifying circuit, is configured to bypass an input signal to the one of the first amplifying circuit and the second amplifying circuit in response to a first control signal. The first bias circuit is configured to supply a first base bias voltage to the first amplifying circuit in response to a second control signal. The second bias circuit is configured to supply a second base bias voltage to the second amplifying circuit in response to a third control signal. The compensating circuit is configured to vary an impedance in response to a fourth control signal and vary a gain compensation at a first output power level based on the varied impedance.

The first output power level may be in an amplification mode and a second output power level may be in a bypass mode, and the first output power level may be higher than the second output power level.

The compensating circuit may be configured to have a first impedance smaller than a second impedance in the bypass mode.

The first bias circuit may be configured to supply the first base bias voltage to the first amplifying circuit connected in parallel to the bypass circuit.

The second bias circuit may be configured to supply the second base bias voltage to the second amplifying circuit connected in parallel to the bypass circuit.

The first bias circuit may be configured to supply the first base bias voltage in response to the second control signal.

The second bias circuit may be configured to variably adjust the second base bias voltage in response to the third control signal.

The first bias circuit may include a first switch circuit configured to switch on or off in response to the second control signal, a first current bias circuit configured to connect to a reference voltage terminal through the first switch circuit to generate a first internal current based on a reference voltage, and a first bias output circuit comprising a first transistor generating the first base bias voltage based on the first internal current.

The second bias circuit may include a first resistance variable circuit configured to vary a resistance value in response to the third control signal, a second current bias circuit configured to connect to the reference voltage terminal through the first resistance variable circuit to generate a second internal current based on the reference voltage and the resistance value of the first resistance variable circuit, a second bias output circuit comprising a second transistor generating the second base bias voltage based on the second internal current, and a capacitor configured to connect between a base of the second transistor and a ground.

The compensating circuit may be configured to connect to one of the first bias circuit and the second bias circuit to have a capacitance or resistance value varied in response to the fourth control signal, and compensate for the second base bias voltage of the second bias circuit.

Upon the amplifying device being configured to operate in an amplification mode, the bypass circuit may be configured to operate in a disabled state. The first bias circuit, the second bias circuit, the first amplifying circuit, and the second amplifying circuit may be configured to operate in an enabled state, respectively. The compensating circuit may be configured to have a first impedance smaller than a second impedance upon the amplifying device being in a bypass mode. Upon the amplifying device being configured to operate in a bypass mode, the first bias circuit supplying the first base bias voltage to the first amplifying circuit to which the bypass circuit may be connected to in parallel operates in a disabled state, and the second bias circuit may operate in an enabled state. The compensating circuit may be configured to have second impedance greater than first impedance when the amplifying device is in an amplification mode.

Upon the amplifying device being configured to operate in a bypass mode, the second bias circuit supplying the second base bias voltage to the second amplifying circuit to which the bypass circuit may be connected to in parallel operates in a disabled state, and the first bias circuit may operate in an enabled state. The compensating circuit may be configured to have second impedance greater than first impedance when the amplifying device is in an amplification mode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
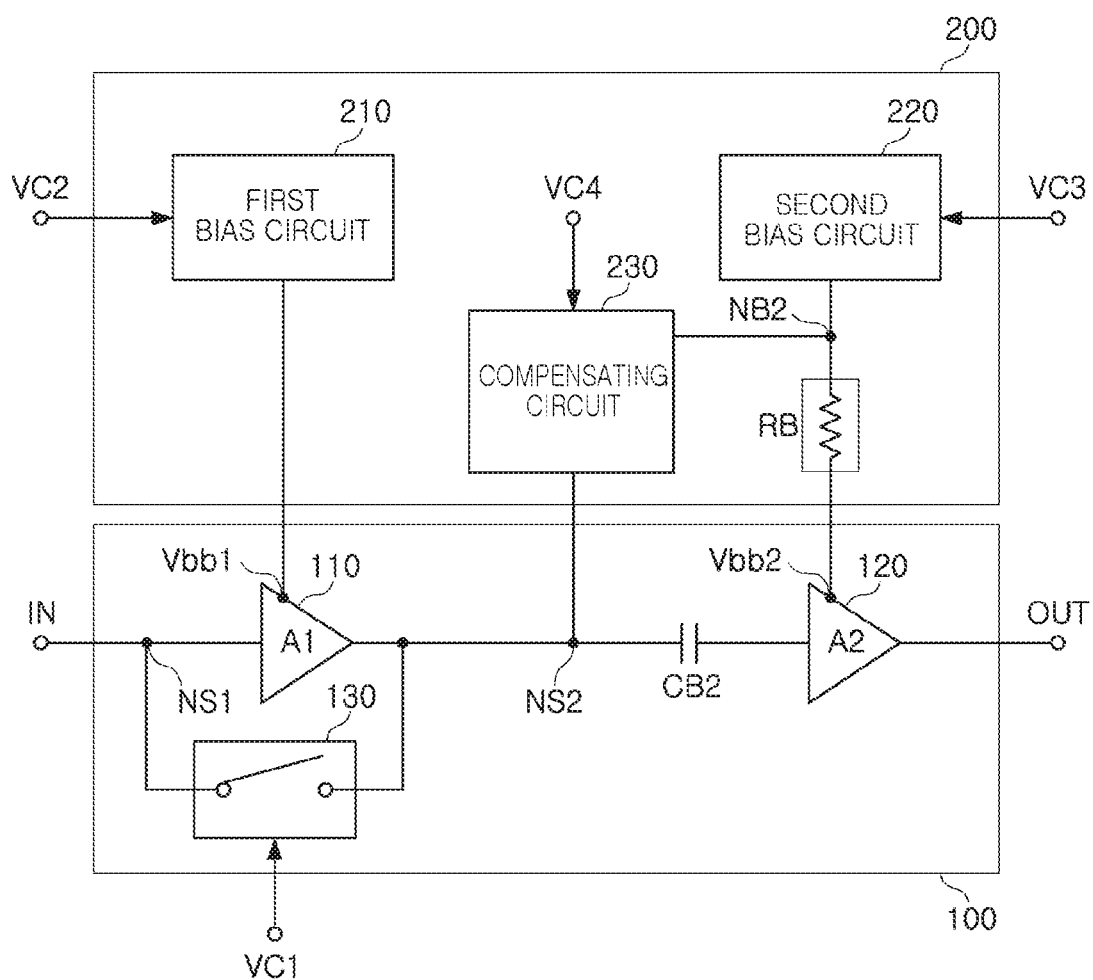
FIG. 1 is a diagram illustrating an example of an amplifying device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
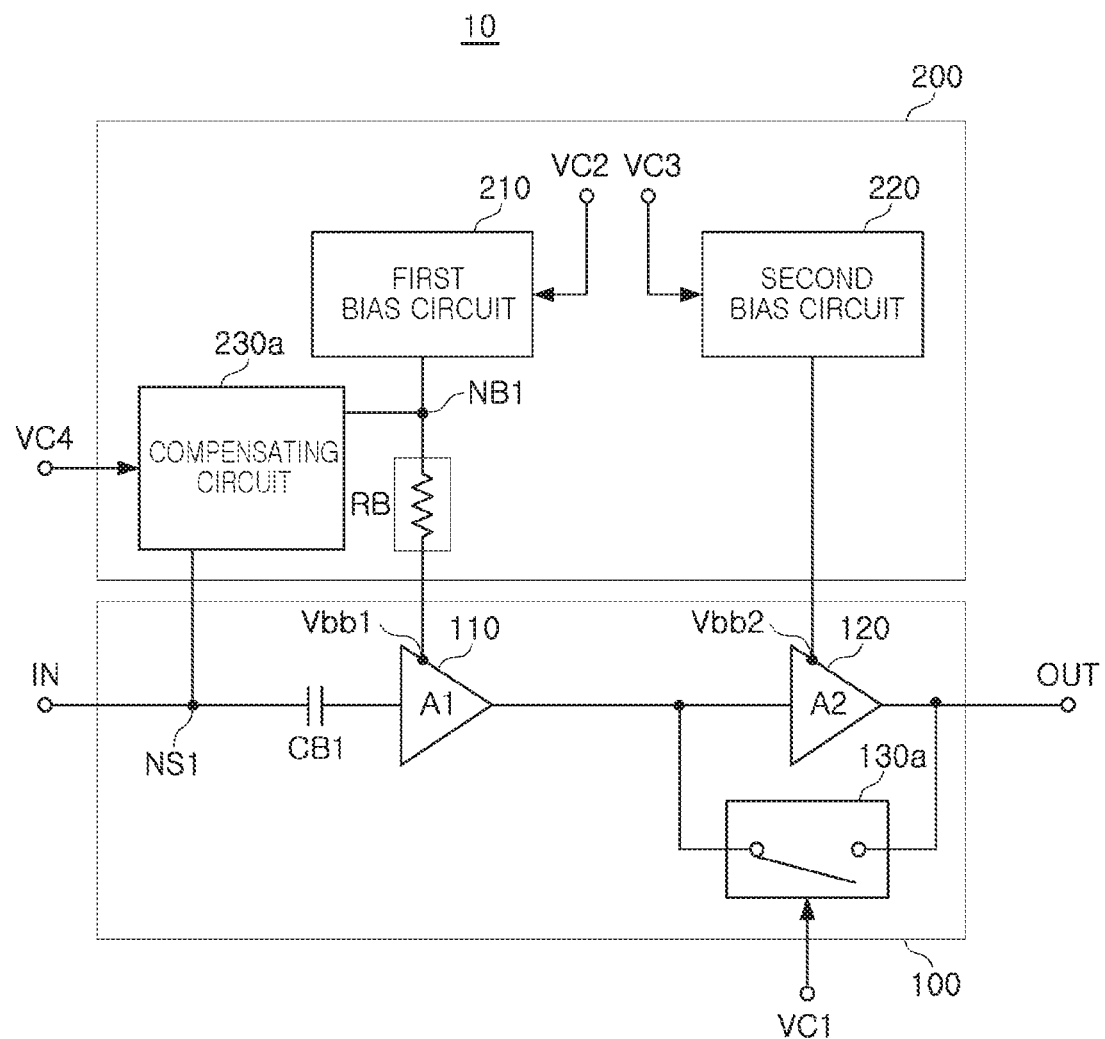
FIG. 2 is a diagram illustrating an example of an amplifying device.

FIG. 1 is a diagram illustrating an example of an amplifying device. FIG. 2 is a diagram illustrating an example of an amplifying device.

Referring to FIGS. 1 and 2, an amplifying device 10 may include an amplifying circuit 100 and a bias circuit 200.

The amplifying circuit 100 may include a first amplifying circuit 110, a second amplifying circuit 120, and a bypass circuit 130.

The bias circuit 200 may include a first bias circuit 210, a second bias circuit 220, and a compensating circuit 230.

The first amplifying circuit 110 and the second amplifying circuit 120 may be connected in series with each other between an imputer terminal IN and an output terminal OUT.

The bypass circuit 130 may be connected in parallel to one of the first amplifying circuit 110 and the second amplifying circuit 120 and may be turned on or off in response to a first control signal VC1. When the bypass circuit 130 is turned on, the bypass circuit 130 may bypass an input signal without amplification.

The first bias circuit 210 may supply a first base bias voltage Vbb1 to the first amplifying circuit 110 in response to a second control signal VC2. The second bias circuit 220 may supply a second base bias voltage Vbb2 to the second amplifying circuit 120 in response to a third control signal VC3.

The compensating circuit 230 may be connected to at least one of the first bias circuit 210 and the second bias circuit 220 to have impedance that is varied in response to a fourth control signal VC4, and may compensate for a base bias voltage of at least one of the first bias circuit 210 and the second bias circuit 220, thereby varying a gain compensation at a high output power level.

Referring to FIG. 1, as an example, the bypass circuit 130 may include one terminal connected to a first signal node NS1 connected to the input terminal IN, and the other terminal connected to a second signal node NS2, and may be connected in parallel to the first amplifying circuit 110.

The first bias circuit 210 may supply the first base bias voltage Vbb1 to the first amplifying circuit 110 that is connected in parallel to the bypass circuit 130. In this case, the first bias circuit 210 may supply the first base bias voltage Vbb1 or stop the supply of the first base bias voltage Vbb1 in response to the second control signal VC2.

In addition, the second bias circuit 220 may variably adjust the second base bias voltage Vbb2 in response to the third control signal VC3. The second bias circuit 220 may supply the second base bias voltage Vbb2 to the second amplifying circuit 120 through a resistor RB.

The compensating circuit 230 may be connected between an output node NB2 of the second bias circuit 220 and the signal node NS2, and may compensate for the second base bias voltage Vbb2 of the second bias circuit 220.

In FIG. 1, a direct current blocking capacitor CB2 may be connected between the second signal node NS2 and the second amplifying circuit 120.

For example, while the amplifying device 10 operates in an amplification mode, the bypass circuit 130 may operate in a disabled state, and each of the first bias circuit 210, the second bias circuit 220, the first amplifying circuit 110, and the second amplifying circuit 120 may operate in an enabled state. The compensating circuit 230 may have a first impedance smaller than a second impedance when the amplifying device 10 is in a bypass mode. Based on the impedance adjustment of the compensating circuit 230, a gain compensation of the amplifying circuit 100 may be varied at an output power level.

In addition, while the amplifying device 10 operates in the bypass mode, the first bias circuit 210 that supplies the first base bias voltage Vbb1 to the first amplifying circuit 110 to which the bypass circuit 130 is connected in parallel may operate in the disabled state, and the second bias circuit 220 may operate in the enabled state. The compensating circuit 230 may have a second impedance greater than a first impedance when the amplifying device 10 is in the amplification mode. Based on the impedance adjustment of the compensating circuit 230, the gain compensation of the amplifying circuit 100 may be varied at an output power level.

In the respective drawings of the present disclosure, unnecessarily overlapped descriptions are possibly omitted for components having the same reference numeral and the same function, and differences in the respective drawings will be described.

Referring to FIG. 2, as an example, the bypass circuit 130a may be connected in parallel to the second amplifying circuit 120 and may be turned on or off in response to a first control signal VC1. When the bypass circuit 130a is turned on, the bypass circuit 130a may bypass an input signal without amplification.

The first bias circuit 210 may supply the first base bias voltage Vbb1 to the first amplifying circuit 110 in response to the second control signal VC2. The first bias circuit 210 may supply the first base bias voltage Vbb1 to the first amplifying circuit 110 through a resistor RB.

The second bias circuit 220 may supply the second base bias voltage Vbb2 to the second amplifying circuit 110 that is connected in parallel to the bypass circuit 130. In this case, the second bias circuit 220 may supply the second base bias voltage Vbb2 or stop the supply of the second base bias voltage Vbb2 in response to the third control signal VC3.

The compensating circuit 230 may be connected between an output node NB1 of the first bias circuit 210 and the first signal node NS1, and may compensate for the first base bias voltage of the first bias circuit 210.

In FIG. 2, a direct current blocking capacitor CB1 may be connected between the first signal node NS1 and the first amplifying circuit 110.

For example, while the amplifying device 10 operates in an amplification mode, the bypass circuit 130a may operate in a disabled state, and each of the first bias circuit 210, the second bias circuit 220, the first amplifying circuit 110, and the second amplifying circuit 120 may operate in an enabled state. The compensating circuit 230a may have a first impedance smaller than a second impedance when the amplifying device 10 is in a bypass mode. Based on the impedance adjustment of the compensating circuit 230a, the gain compensation of the amplifying circuit 100 may be varied at an output power level.

In addition, while the amplifying device 10 operates in the bypass mode, the second bias circuit 220 that supplies the second base bias voltage Vbb2 to the second amplifying circuit 120 to which the bypass circuit 130a is connected in parallel may operate in the disabled state, and the first bias circuit 210 may operate in the enabled state. The compensating circuit 230a may have a second impedance greater than a first impedance when the amplifying device 10 is in the amplification mode. Based on the impedance adjustment of the compensating circuit 230a, the gain compensation of the amplifying circuit 100 may be varied at an output power level.

In FIGS. 1 and 2, as an example, the first control signal VC1, the second control signal VC2, the third control signal VC3, and the fourth control signal VC4 may be provided from a control circuit (not illustrated) and a baseband circuit (not illustrated). As an example, a voltage level of each of the first control signal VC1, the second control signal VC2, the third control signal VC3, and the fourth control signal VC4 may be set to a high level or a low level based on the amplification mode (first operating mode) and the bypass mode (second operating mode).

Figure 3:
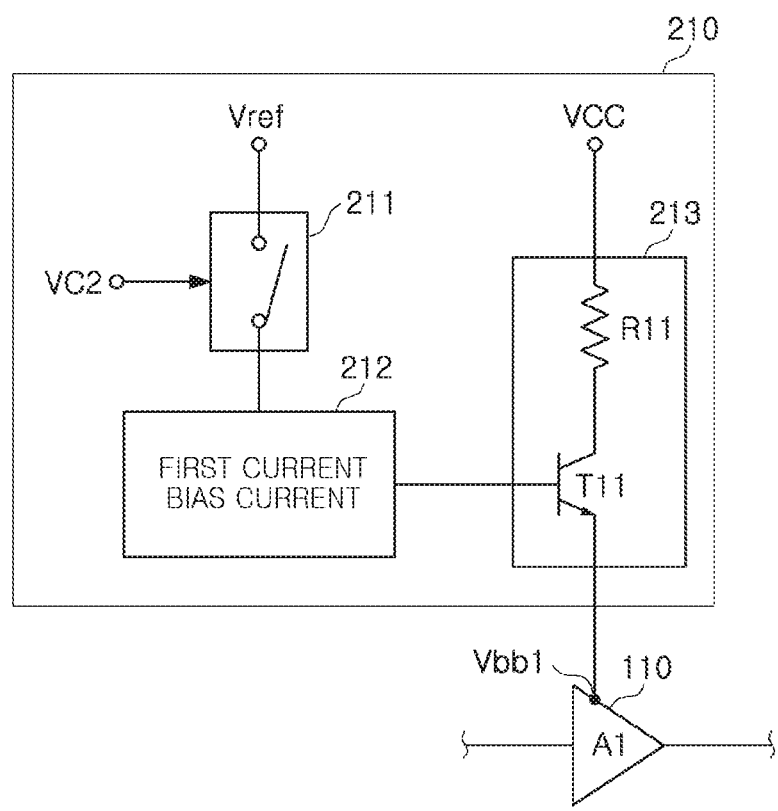
FIG. 3 is a diagram illustrating an example of a first bias circuit.

FIG. 3 is a diagram illustrating an example of a first bias circuit.

Referring to FIG. 3, the first bias circuit 210 may include a first switch circuit 211, a first current bias circuit 212, and a first bias output circuit 213.

The first switch circuit 211 may be switched on or switched off in response to the second control signal VC2. As an example, the first switch circuit 211 may be turned off in the bypass mode and may be turned on in the amplification mode, in response to the second control signal VC2.

The first current bias circuit 212 may be connected to a reference voltage Vref terminal through the first switch circuit 211 to generate a first internal current based on a reference voltage Vref.

In addition, the first bias output circuit 213 may include a resistor R11 and a first transistor T11. A collector of the first transistor T11 may be connected to a power source voltage VCC terminal through the resistor R11, a base thereof may be connected to the first current bias circuit 212, and an emitter thereof may be connected to the first amplifying circuit 110. The first transistor T11 may supply the first base bias voltage Vbb1 based on the first internal current.

Figure 4:
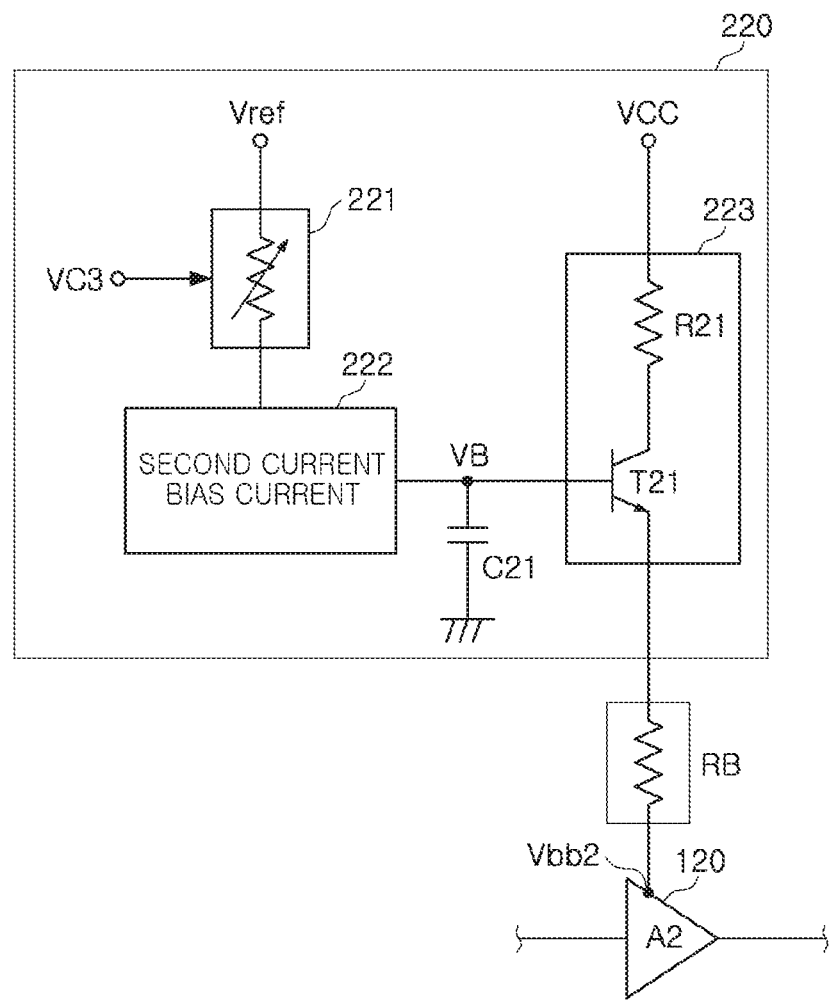
FIG. 4 is a diagram illustrating an example of a second bias circuit.

FIG. 4 is a diagram illustrating an example of a second bias circuit.

Referring to FIG. 4, the second bias circuit 220 may include a first resistance variable circuit 221, a second current bias circuit 222, a second bias output circuit 223, and a capacitor C21.

The first resistance variable circuit 221 may vary a resistance value in response to the third control signal VC3. As an example, the first resistance variable circuit 221 may increase the resistance value in the bypass mode, and may thus decrease the bias current, thereby reducing current consumption. Unlike this, the first resistance variable circuit 221 may reduce the resistance value in the amplification mode and vice versa.

The second current bias circuit 222 may be connected to the reference voltage Vref terminal through the first resistance variable circuit 221 to generate a second internal current based on a reference voltage Vref and the resistance value of the first resistance variable circuit 221.

The second bias output circuit 223 may include a resistor R21 and a second transistor T21. A collector of the second transistor T21 may be connected to the power source voltage VCC terminal through the resistor R21, a base thereof may be connected to the second current bias circuit 222, and an emitter thereof may be connected to the second amplifying circuit 120. The second transistor T21 may supply the second base bias voltage Vbb2 based on the second internal current.

In addition, the capacitor C21 may be connected between the base of the second transistor T12 and the ground to contribute to the stabilization of a base voltage VB supplied to the base of the second transistor T12.

Meanwhile, the RF signal introduced into the second transistor T12 through the compensating circuit 230 may be rectified through the emitter and the base of the second transistor T12, and a rectified voltage may be added to the base voltage VB. As a result, the base voltage VB may be varied based on the RF signal introduced into the second transistor T12 through the compensating circuit 230.

Figure 5:
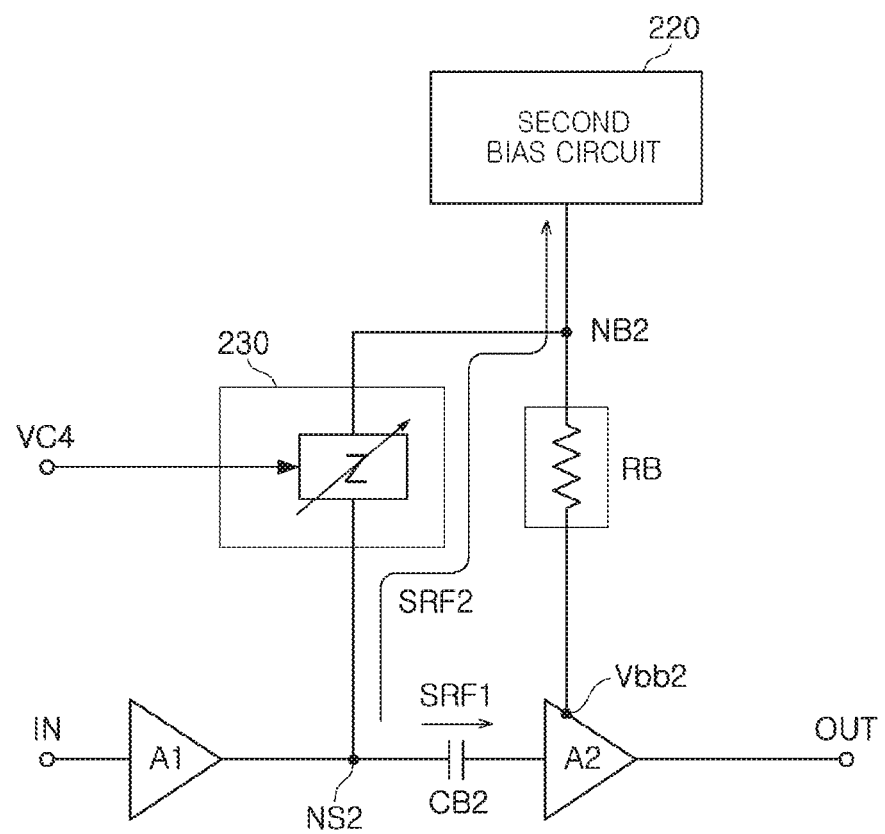
FIG. 5 is a diagram illustrating an example of an operation of a compensating circuit.

FIG. 5 is a diagram illustrating an example of an operation of a compensating circuit.

Referring to FIG. 5, the compensating circuit 230 may be, for example, connected between the output node NB2 of the second bias circuit 220 and the signal node NS2, and the impedance may be varied based on the fourth control signal VC4. As described above, the compensating circuit 230 may adjust the degree of the RF signal contributing to the compensation of the first base bias voltage Vbb1.

As an example, when the impedance of the compensating circuit 230 is varied by the fourth control signal VC4 based on the operating mode, an amplitude level of the RF signal SRF2 transmitted to the second bias circuit 220 through the compensating circuit 230 at the second signal node NS2 connected to the output terminal of the amplifying circuit 110 may be varied. Accordingly, the second bias circuit 220 may compensate for the second base bias voltage Vbb2 based on the amplitude level of the RF signal SRF2 transmitted through the compensating circuit 230.

In this example, the amplification gain may be changed based on the operating mode such as the amplification mode, which may be the first operating mode, the bypass mode, which may be the second operating mode, or the like, and the amplification gain may be changed based on the varied bias current. Therefore, it may be necessary to compensate for the bias based on the RF signal to have linear characteristics suitable for each operating mode, and the compensating circuit 230 may adjust the degree of contribution of the RF signal for bias compensation, which will be described with reference to FIG. 8.

Figure 6:
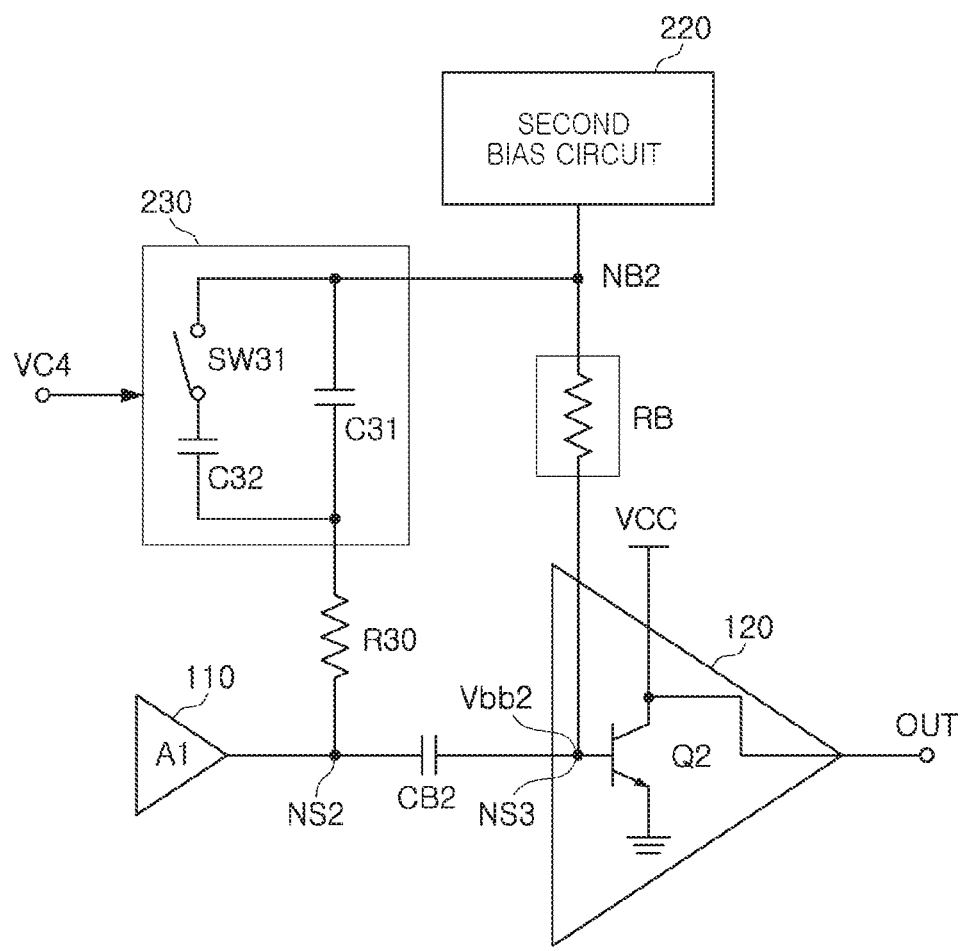
FIG. 6 is a diagram illustrating an example of the compensating circuit.
Figure 7:
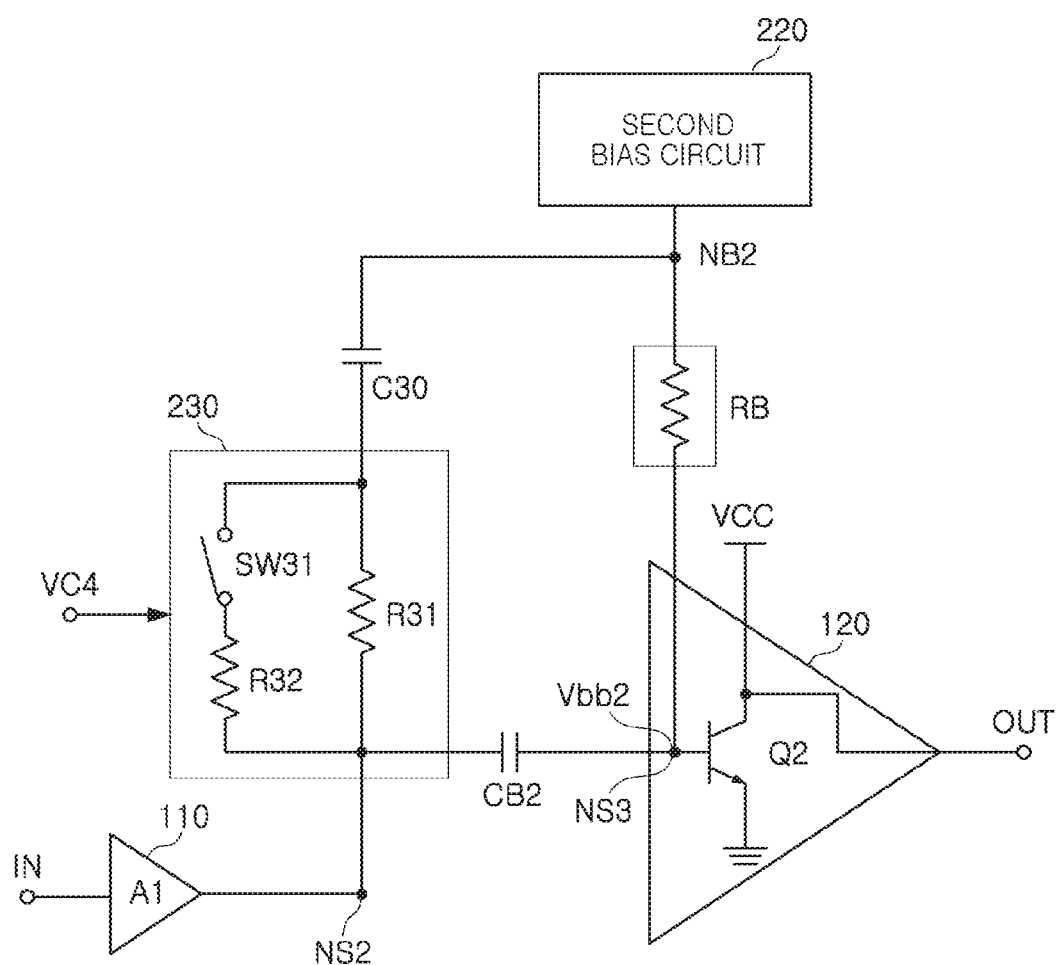
FIG. 7 is a diagram illustrating an example of the compensating circuit.

FIG. 6 is a diagram illustrating an example of the compensating circuit and FIG. 7 is a diagram illustrating an example of the compensating circuit.

Referring to FIGS. 6 and 7, the compensating circuit 230 may have a capacitance or resistance value varied based on the fourth control signal VC4, and may thus compensate for the second base bias voltage Vbb2 of the second bias circuit 220.

An implementation example of the compensating circuit will be described with reference to FIGS. 6 and 7.

Referring to FIG. 6, the compensating circuit 230 may include a first capacitor C31 connected between the output node NB2 of the second bias circuit 220 and the second signal node NS2, and a first switch SW31 and a second capacitor C32, connected in series, are connected in parallel to the first capacitor C31. As an example, a resistor R30 may be connected between the first capacitor CB1 and the second signal node NS2.

The first switch SW31 may be turned on or off based on the fourth control signal VC4. The capacitance determined by the first capacitor C31 and the second capacitor C32 that are connected in parallel to each other may be varied based on the turning of the first switch SW31 on or off. The amplitude level of the RF signal SRF2 transmitted to the second bias circuit 220 through the compensating circuit 230 at the second signal node NS2 connected to the output terminal of the first amplifying circuit 110 may be varied by the varied capacitance.

Accordingly, the second bias circuit 220 may compensate for the second base bias voltage Vbb2 based on the amplitude level of the RF signal SRF2 transmitted through the compensating circuit 230.

For example, referring to FIG. 6, an optimization value of the capacitance in the compensating circuit 230 may require a relatively large value (small impedance) in the first operating mode (amplification mode), and may require a relatively small value (large impedance) in the second operating mode (bypass mode), which may reduce current consumption in the second operating mode (bypass mode).

In other words, the compensating circuit 230 may operate as a resistor having an on-resistance Ron value when the first switch SW1 of the compensating circuit 230 is turned on, and may operate as a capacitor having an off-capacitance Coff value when the first switch SW31 is turned off.

When the capacitance of the second capacitor C32 to which the first switch SW31 is connected is C2 and the capacitance of the first capacitor C31 of the other path is C1, the first switch SW31 may be turned on in the first operating mode (amplification mode) and the total capacitance may be a relatively large capacitance (C1+C2). In addition, in the second operating mode (bypass mode), the first switch SW31 may be turned off, a capacitance of a path to which the turned-off first switch SW31 is connected may be a capacitance of a series connection of the capacitance of the second capacitance C32 and the off capacitance Coff, and the off capacitance may be a relatively very small switch capacitance Csw using a switch as small as possible.

Accordingly, in the second operating mode (bypass mode), the total capacitance may be a sum of the switch capacitance Csw and the capacitance C1 of the first capacitor C31, and may be a relatively small capacitance relative to the first operating mode (amplification mode).

Referring to FIG. 7, the compensating circuit 230 may include a first resistor R31 connected between the output node NB2 of the second bias circuit 220 and the second signal node NS2, and the first switch SW31 and a second resistor R32, connected in series, are connected in parallel to the first resistor R31. As an example, a capacitor C30 may be connected between the first resistor R31 and the second bias circuit 220.

The first switch SW31 may be turned on or off based on the fourth control signal VC4, and a resistance value determined by the first resistor R31 and the second resistor R32 that are connected in parallel to each other may be varied based on the turning of the first switch SW31 on or off. The amplitude level of the RF signal SRF2 transmitted to the second bias circuit 220 through the compensating circuit 230 at the second signal node NS2 connected to the output terminal of the first amplifying circuit 110 may be varied by the varied resistance value.

As a result, the second bias circuit 220 may compensate for the second base bias voltage Vbb2 based on the amplitude level of the RF signal SRF2 transmitted through the compensating circuit 230.

For example, referring to FIG. 7, an optimization value of the resistor in the compensating circuit 230 may require a relatively small value (small impedance) in the first operating mode (amplification mode), and may require a relatively large value (large impedance) in the second operating mode (bypass mode). This may reduce current consumption in the second operating mode (bypass mode).

In detail, when a resistance value of the second resistor R32 to which the first switch SW31 is connected is R2 and a resistance value of the first resistor R1 of the other path is R1, the first switch SW31 may be turned on in the first operating mode. A resistance Rsw of a path to which the first switch SW31 is connected may be a sum (Rsw=Ron+R2) of on-resistance Ron and the resistance value R2 of the second resistor R32. The on-resistance may be set to as small as possible. Therefore, the total resistance may be a relatively small resistance value (Rsw//R1), which is a parallel sum of the resistance Rsw of the path to which the first switch SW31 is connected and the first resistance value R1.

In addition, in the second operating mode (bypass mode), the first switch SW31 is turned off and the resistance Rsw of the path to which the first switch SW31 is connected is a value relatively larger than the resistance value R1 of the first resistor R31, such that the resistance value in the second operating mode may be a value close to the first resistance value R1, and may be a relatively large resistance value as compared to the first operating mode.

Figure 8:
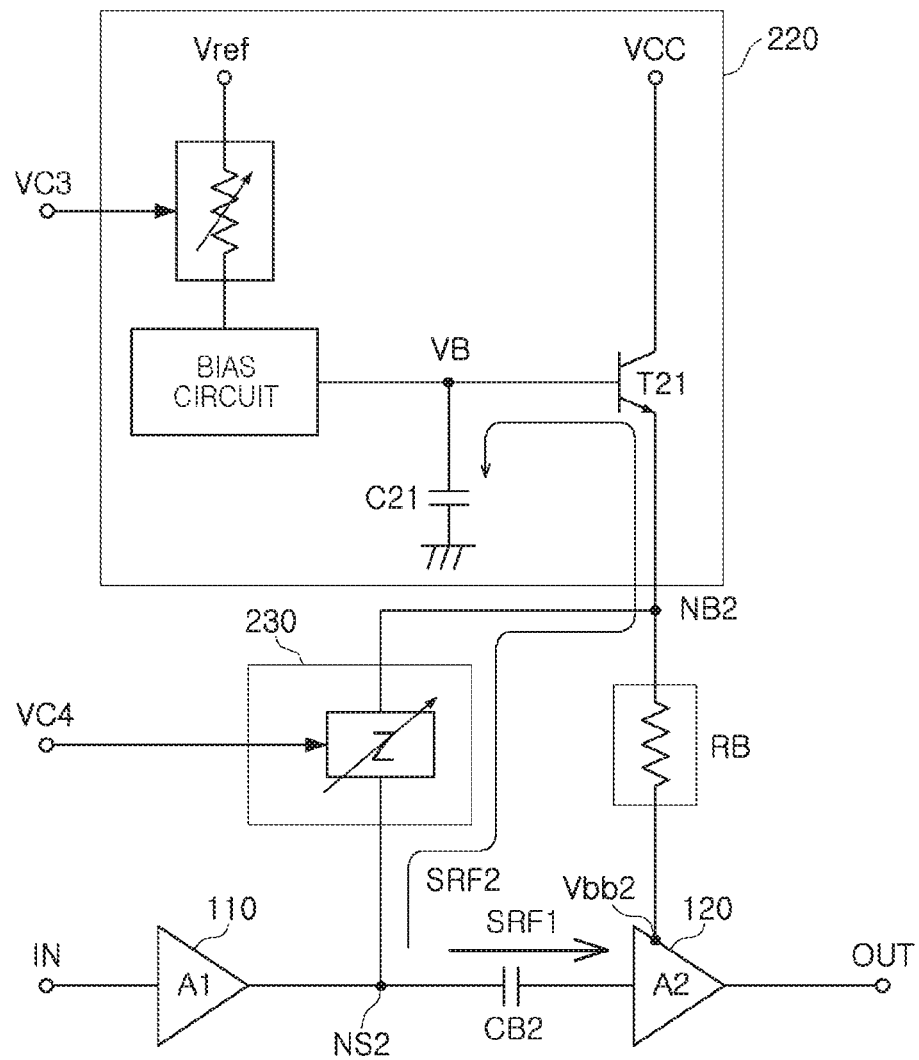
FIG. 8 is a diagram for describing an operation of the compensating circuit.

FIG. 8 is a diagram for describing an operation of the compensating circuit.

Referring to FIGS. 5 through 8, the compensating circuit 230 may be connected to the second bias circuit 220, and the impedance thereof may be varied based on the fourth control signal VC4. When the impedance of the compensating circuit 230 is varied, an amplitude level of the RF signal SRF2 transmitted to the second bias circuit 220 through the compensating circuit 230 at the second signal node NS2 connected to the output terminal of the amplifying circuit 110 and bypassed to the ground may be varied.

Accordingly, the second base bias voltage Vbb2 of the second transistor T12 may be varied based on the amplitude level of the RF signal SRF2 transmitted to the second bias circuit 220 through the second compensating circuit 230.

As an example, in the case of the bypass mode, the supply of the first base bias voltage Vbb1 may be blocked, and when the second base bias voltage Vbb2 is increased, the gain of the second amplifying circuit 120 may be increased. However, the compensating circuit 230 may decrease and compensate for the second base bias voltage Vbb2. In this case, the increase in the gain of the second amplifying circuit 120 may be prevented, and the gain of the second amplifying circuit 120 may be linearized.

For example, in the case of the first operating mode (amplification mode) in which both of the first amplifying circuit 110 and the second amplifying circuit 120 operate because a relatively large gain is required, the input RF signal may be amplified and output to a high gain by the first amplifying circuit 110 and the second amplifying circuit 120. As another example, in the case of the second operating mode (bypass mode) in which the bypass circuit is turned on, the first amplifying circuit 110 is turned off, and only the second amplifying circuit 120 operates because a relatively small gain is required, the input RF signal may pass through the bypass circuit and may be then amplified and output to a low gain by the second amplifying circuit 120.

As described above, the amplification gain may be high in the first operating mode (amplification mode) and may be low in the second operating mode (bypass mode).

Here, in the second operating mode (bypass mode) having a relatively low amplification gain, the first amplifying circuit 110 may be turned off, the second amplifying circuit 120 may be turned on, and the second base bias voltage Vbb2 supplied to the second amplifying circuit 120 that is turned on may be adjusted to reduce the current consumption.

As such, the second bias circuit 220 may vary the second base bias voltage Vbb2 to reduce the current consumption through the operation processes as described above.

Meanwhile, the compensating circuit 230 may compensate for the second base bias voltage Vbb2 of the second bias circuit 220 based on the amplitude level of the input RF signal to improve linear characteristics.

In addition, the bypass circuits 130 and 130a may include a match circuit to optimize matching performance. In addition, in the second operating mode, when the gain is larger than a gain target value, an attenuator for lowering the gain may be added to the input terminal or the output terminal of the second amplifying circuit.

Figure 9:
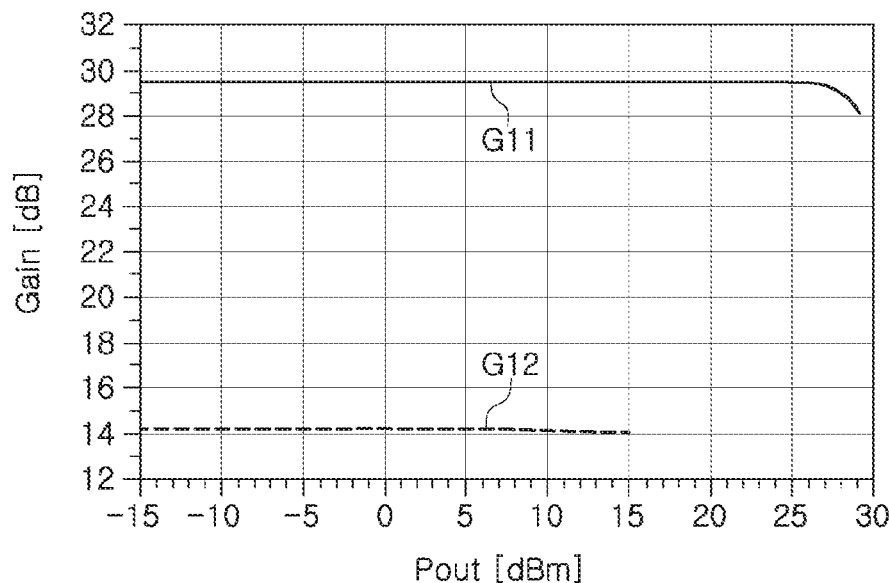
FIG. 9 is a diagram illustrating an example of a gain for each operating mode of an amplifying device.

FIG. 9 is a diagram illustrating an example of a gain for each operating mode of an amplifying device.

In FIG. 9, G11 denotes a gain at 2.45 GHz, which is determined by the first amplifying circuit and the second amplifying circuit of the amplifying circuit 100 in the amplification mode in which the bypass circuit is turned off. G12 denotes a gain at 2.45 GHz, which is determined by the second amplifying circuit of the amplifying circuit 100 in the bypass mode in which the bypass circuit is turned on, and the first bias circuit and the first amplifying circuit are disabled.

Referring to G11 and G12 illustrated in FIG. 9, when an output power level is 15 dBm, a difference in the gain depicted is about 16 dB.

Figure 10:
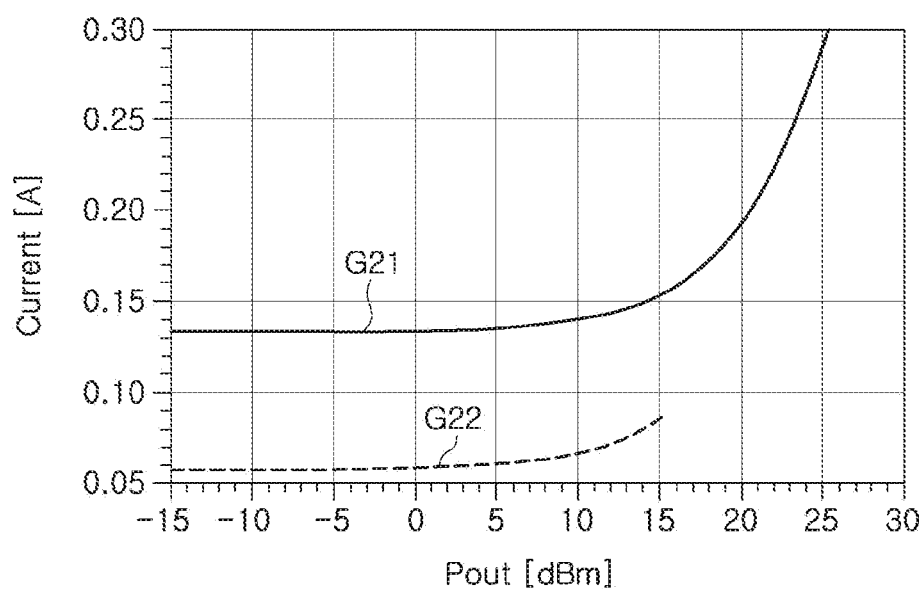
FIG. 10 is a diagram illustrating an example of current consumption for each operating mode of the amplifying device.

FIG. 10 is a diagram illustrating an example of current consumption for each operating mode of the amplifying device.

In FIG. 10, G21 denotes current consumption in the second amplifying circuit of the amplifying circuit 100 in the amplification mode in which the bypass mode is turned off. G22 denotes a current consumption in the second amplifying circuit of the amplifying circuit 100 in the bypass mode in which the bypass mode is turned on, the first bias circuit and the first amplifying circuit are disabled.

Referring to G21 and G22 illustrated in FIG. 10, when the output power level is 15 dBm, a difference in the current consumed in the second amplifying circuit depicted is about 70 mA.

Figure 11:
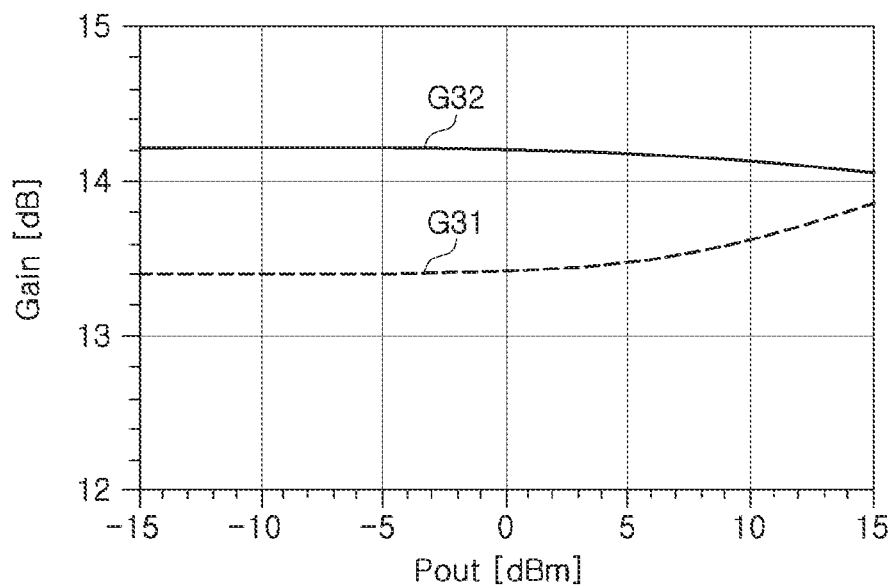
FIG. 11 is a diagram illustrating an example of a gain compensation by a compensating circuit in a bypass mode of the amplifying device.

FIG. 11 is a diagram illustrating an example of a gain compensation by a compensating circuit in a bypass mode of the amplifying device.

In FIG. 11, G31 denotes a gain graph of the amplifying circuit in the bypass mode when a resistance value optimized to the amplification mode is applied in a case in which an invariable single resistor element is applied to the compensating circuit. G32 denotes a gain of the amplifying circuit in the bypass mode when the compensating circuit is implemented by a variable resistor circuit to apply an optimal resistance value for each operating mode to the compensating circuit.

Referring to G31 and G32 of FIG. 11, it may be seen that an amount of change in the gain is small as the output power level is increased when the compensating circuit to which the resistance value optimized to the respective operating modes may be applied may be used.

Figure 12:
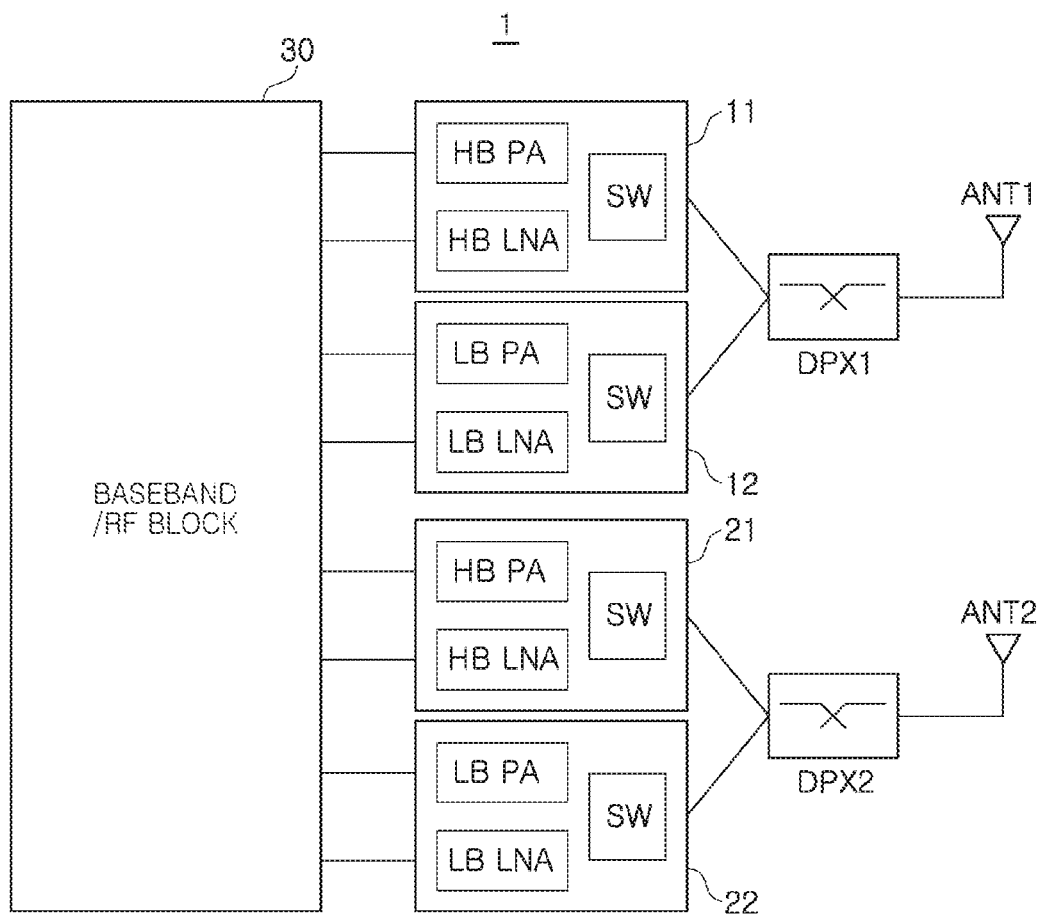
FIG. 12 is a diagram illustrating an example of an application of the amplifying device.

FIG. 12 is a diagram illustrating an example of an application of the amplifying device.

Referring to FIG. 12, the amplifying device may be applied to a communications system 1. The communications system 1 may include a plurality of antennas ANT1 and ANT2, diplexers DPX1 and DPX2, and amplification blocks 11, 12, 21, and 22 including a switch and a transmission and reception amplifier PA and LNA, respectively, and a baseband/RF block 30.

Either one or both of the antenna ANT1 and ANT2 may each be connected to the switch, the transmission and reception amplifier PA and LNA of a high band HB and a low band LB through the diplexer, and the baseband/RF block 30.

The baseband/RF block 30 may provide control signals VC1 and VC2 that may control operations of the transmission and reception amplifier and switch.

The amplification blocks 11, 12, 21, and 22 may each include amplifiers PAs, e.g., four power amplifiers PAs. When the four power amplifiers are used in a specific transmission mode, two power amplifiers may operate in a first operating mode, the other two power amplifiers may operate in a second operating mode different from the first operating mode, which may reduce the power consumption and heat generation of the power amplifiers.

In the examples, the control circuit of the amplifying circuit may be implemented in a computing environment in which a processor (e.g., a central processing unit (CPU), a graphic processing unit (GPU), a microprocessor, an application specific integrated circuit (ASIC), a field programmable gate arrays (FPGA), or the like), a memory (e.g., a volatile memory (e.g., a random access memory (RAM), or the like), a non-volatile memory (e.g., a read only memory (ROM), a flash memory, or the like)), an input device (e.g., a keyboard, a mouse, a pen, a voice input device, a touch input device, an infrared camera, a video input device, or the like), an output device (e.g., a display, a speaker, a printer, or the like), and a communications connection device (e.g., MODEM, a network interface card (NIC), an integrated network interface, a radio frequency transmitter/receiver, an infrared port, a USB connection device, or the like) are interconnected (e.g., peripheral component interconnect (PCI), USB, firmware (IEEE 1394), optical bus structure, network, or the like).

As set forth above, according to the embodiments in the present disclosure, some of the plurality of amplification stages may be switched on or off. The biases of the other or alternate ones of the plurality of amplification stages may be varied and compensated when implementing plural operating modes having different gains in the power amplifier including the plurality of amplification stages.

Accordingly, the bias circuit and the amplifying device may be applied to implement different operating modes in which a difference in the gain and power level is large, and since the amplification circuit and the matching circuit are not included in each amplification path as compared to the conventional power amplifier using the plurality of amplifiers and impedance matching circuits in each of the plurality of amplification paths, the bias circuit and the amplifying device may be manufactured in a relatively small size and at a lower cost.

In addition, the bias may be compensated based on the amplitude level of the RF signal to be suitable for each operating mode to improve the linear characteristics of the amplifying device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias circuit of an amplifying device including amplifying circuits, connected to each other in series, and a bypass circuit responding to a first control signal, the bias circuit comprising:

a first bias circuit, configured to supply a first base bias voltage to a first amplifying circuit of the amplifying circuits in response to a second control signal, comprising a first switch circuit configured to switch on or off in response to the second control signal, and a first current bias circuit configured to connect to a reference voltage terminal through the first switch circuit to generate a first internal current based on a reference voltage;

a second bias circuit configured to supply a second base bias voltage to a second amplifying circuit of the amplifying circuits in response to a third control signal; and a compensating circuit connected to either one or both of the first bias circuit and the second bias circuit, and configured to vary impedance in response to a fourth control signal, and compensate for either one or both of the first base bias voltage and the second base bias voltage based on the varied impedance.

2. The bias circuit of claim 1, wherein the first bias circuit is configured to supply the first base bias voltage to the first amplifying circuit connected in parallel to the bypass circuit.

3. The bias circuit of claim 1, wherein the second bias circuit is configured to supply the second base bias voltage to the second amplifying circuit connected in parallel to the bypass circuit.

4. The bias circuit of claim 2, wherein the first bias circuit is configured to supply the first base bias voltage in response to the second control signal.

5. The bias circuit of claim 4, wherein the second bias circuit is configured to variably adjust the second base bias voltage in response to the third control signal.

6. A bias circuit of an amplifying device including amplifying circuits, connected to each other in series, and a bypass circuit responding to a first control signal, the bias circuit comprising:

a first bias circuit, configured to supply a first base bias voltage to a first amplifying circuit of the amplifying circuits in response to a second control signal, supply the first base bias voltage to the first amplifying circuit connected in parallel to the bypass circuit, and supply the first base bias voltage in response to the second control signal;

a second bias circuit configured to supply a second base bias voltage to a second amplifying circuit of the amplifying circuits in response to a third control signal, and variably adjust the second base bias voltage in response to the third control signal; and a compensating circuit connected to either one or both of the first bias circuit and the second bias circuit, and configured to vary impedance in response to a fourth control signal, and compensate for either one or both of the first base bias voltage and the second base bias voltage based on the varied impedance, wherein the first bias circuit comprises:

a first switch circuit configured to switch on or off in response to the second control signal;

a first current bias circuit configured to connect to a reference voltage terminal through the first switch circuit to generate a first internal current based on a reference voltage; and a first bias output circuit comprising a first transistor generating the first base bias voltage based on the first internal current.

7. The bias circuit of claim 6, wherein the second bias circuit comprises:

a first resistance variable circuit configured to vary a resistance value in response to the third control signal;

a second current bias circuit configured to connect to the reference voltage terminal through the first resistance variable circuit to generate a second internal current based on the reference voltage and the resistance value of the first resistance variable circuit;

a second bias output circuit comprising a second transistor generating the second base bias voltage based on the second internal current; and a capacitor configured to connect between a base of the second transistor and a ground.

8. The bias circuit of claim 6, wherein the compensating circuit is configured to have a capacitance or resistance value varied in response to the fourth control signal, and compensate for the second base bias voltage of the second bias circuit.

9. The bias circuit of claim 2, wherein upon the amplifying device being configured to operate in an amplification mode, the first bias circuit and the second bias circuit are configured to operate in an enabled state, and the compensating circuit is configured to have a first impedance, and upon the amplifying device being configured to operate in a bypass mode, the first bias circuit supplying the first base bias voltage to the first amplifying circuit to which the bypass circuit is connected to in parallel operates in a disabled state, and the second bias circuit is configured to operate in the enabled state, and wherein the compensating circuit is configured to have a second impedance greater than the first impedance.

10. The bias circuit of claim 3, wherein upon the amplifying device being configured to operate in an amplification mode, the first bias circuit and the second bias circuit are configured to operate in an enabled state, and the compensating circuit is configured to have a first impedance, and upon the amplifying device being configured to operate in a bypass mode, the second bias circuit supplying the second base bias voltage to the second amplifying circuit to which the bypass circuit is connected to in parallel operates in a disabled state, and the first bias circuit is configured to operate in the enabled state, and wherein the compensating circuit is configured to have a second impedance greater than the first impedance.

11. An amplifying device comprising:

a first amplifying circuit and a second amplifying circuit, connected to each other in series between an input terminal and an output terminal of the amplifying device;

a bypass circuit, connected in parallel to one of the first amplifying circuit and the second amplifying circuit, configured to bypass an input signal to the one of the first amplifying circuit and the second amplifying circuit in response to a first control signal;

a first bias circuit, configured to supply a first base bias voltage to the first amplifying circuit in response to a second control signal, comprising a first switch circuit configured to switch on or off in response to the second control signal, and a first current bias circuit configured to connect to a reference voltage terminal through the first switch circuit to generate a first internal current based on a reference voltage;

a second bias circuit configured to supply a second base bias voltage to the second amplifying circuit in response to a third control signal; and a compensating circuit configured to vary impedance in response to a fourth control signal and vary a gain compensation at a first output power level based on the varied impedance.

12. The amplifying device of claim 11, wherein the first output power level is in an amplification mode and a second output power level is in a bypass mode, and the first output power level is higher than the second output power level.

13. The amplifying device of claim 12, wherein the compensating circuit is configured to have a first impedance smaller than a second impedance in the bypass mode.

14. The amplifying device of claim 11, wherein the first bias circuit is configured to supply the first base bias voltage to the first amplifying circuit connected in parallel to the bypass circuit.

15. The amplifying device of claim 11, wherein the second bias circuit is configured to supply the second base bias voltage to the second amplifying circuit connected in parallel to the bypass circuit.

16. The amplifying device of claim 14, wherein the first bias circuit is configured to supply the first base bias voltage in response to the second control signal.

17. The amplifying device of claim 16, wherein the second bias circuit is configured to variably adjust the second base bias voltage in response to the third control signal.

18. The amplifying device of claim 11, wherein the first bias circuit further comprises:

a first bias output circuit comprising a first transistor generating the first base bias voltage based on the first internal current.

19. The amplifying device of claim 16, wherein the second bias circuit comprises:

a first resistance variable circuit configured to vary a resistance value in response to the third control signal;

a second current bias circuit configured to connect to the reference voltage terminal through the first resistance variable circuit to generate a second internal current based on the reference voltage and the resistance value of the first resistance variable circuit;

a second bias output circuit comprising a second transistor generating the second base bias voltage based on the second internal current; and a capacitor configured to connect between a base of the second transistor and a ground.

20. The amplifying device of claim 19, wherein the compensating circuit is configured to connect to one of the first bias circuit and the second bias circuit to have a capacitance or resistance value varied in response to the fourth control signal, and compensate for the second base bias voltage of the second bias circuit.

21. The amplifying device of claim 11, wherein upon the amplifying device being configured to operate in an amplification mode,
- the bypass circuit is configured to operate in a disabled state,
- the first bias circuit, the second bias circuit, the first amplifying circuit, and the second amplifying circuit are configured to operate in an enabled state, respectively, and
- the compensating circuit is configured to have a first impedance smaller than a second impedance upon the amplifying device being in a bypass mode.

22. The amplifying device of claim 14, wherein upon the amplifying device being configured to operate in a bypass mode,
- the first bias circuit supplying the first base bias voltage to the first amplifying circuit to which the bypass circuit is connected to in parallel operates in a disabled state, and the second bias circuit operates in an enabled state, and
- the compensating circuit is configured to have a second impedance greater than first impedance when the amplifying device is in an amplification mode.

23. The amplifying device of claim 15, wherein upon the amplifying device being configured to operate in a bypass mode,
- the second bias circuit supplying the second base bias voltage to the second amplifying circuit to which the bypass circuit is connected to in parallel operates in a disabled state, and the first bias circuit operates in an enabled state, and
- the compensating circuit is configured to have a second impedance greater than first impedance when the amplifying device is in an amplification mode.

* * * * *